United States Patent
Honkomp

(10) Patent No.: US 11,973,410 B2
(45) Date of Patent: Apr. 30, 2024

(54) METHOD FOR DETERMINING AN INTERMEDIATE CIRCUIT VOLTAGE

(71) Applicant: AUDI AG, Ingolstadt (DE)

(72) Inventor: Franz Honkomp, Ingolstadt (DE)

(73) Assignee: AUDI AG, Ingolstadt (DE)

( * ) Notice: Subject to any disclaimer, the term of this patent is extended or adjusted under 35 U.S.C. 154(b) by 284 days.

(21) Appl. No.: 17/568,377

(22) Filed: Jan. 4, 2022

(65) Prior Publication Data
US 2022/0294329 A1   Sep. 15, 2022

(30) Foreign Application Priority Data

Mar. 15, 2021   (DE) .......................... 102021106258.6

(51) Int. Cl.
*H02M 1/00*   (2006.01)
*G01R 31/3835*   (2019.01)

(52) U.S. Cl.
CPC ...... *H02M 1/0003* (2021.05); *G01R 31/3835* (2019.01)

(58) Field of Classification Search
CPC .. H02M 1/0003; H02M 1/0022; H02M 1/007; G01R 31/3835
See application file for complete search history.

(56) References Cited

U.S. PATENT DOCUMENTS

| 6,205,042 B1 | 3/2001 | Bixel | |
|---|---|---|---|
| 2009/0225571 A1* | 9/2009 | Eldery | H02M 7/53873 363/41 |

(Continued)

FOREIGN PATENT DOCUMENTS

| DE | 102016200663 A1 | 7/2017 |
|---|---|---|
| EP | 2546969 A1 | 1/2013 |
| KR | 20070072089 A | 7/2007 |

OTHER PUBLICATIONS

German Examination Report dated Nov. 10, 2021 in corresponding German Application No. 102021106258.6; 14 pages; Machine translation attached.

*Primary Examiner* — Jue Zhang
*Assistant Examiner* — Afework S Demisse
(74) *Attorney, Agent, or Firm* — Maier & Maier, PLLC

(57) ABSTRACT

A method for determining an intermediate circuit voltage $U_{DC,Ideal}$ in an electrical system, which includes a battery, a DC-DC converter, a DC-AC converter, and an electrical machine. The battery is connected to the DC-DC converter, the DC-DC converter is connected to the DC-AC converter, and the DC-AC converter is connected to the electrical machine. An intermediate circuit of the electrical system is formed by the DC-DC converter and the DC-AC converter. A line-to-line voltage $\hat{U}_{LL}$, which is applied to a conductor of the electrical machine, is determined, wherein a maximum degree of modulation $m_{max}$ of the line-to-line voltage $\hat{U}_{LL}$ is determined. The intermediate circuit voltage $U_{DC,Ideal}$ is determined according to the equation $$U_{DC,Ideal} = \frac{\hat{U}_{LL}}{m_{max}}$$

20 Claims, 1 Drawing Sheet

(56) References Cited

U.S. PATENT DOCUMENTS

2009/0302682 A1\* 12/2009 Hammond .............. H02M 7/49
307/52
2010/0066277 A1 3/2010 Bailey \* cited by examiner

US 11,973,410 B2

METHOD FOR DETERMINING AN INTERMEDIATE CIRCUIT VOLTAGE

FIELD

The invention relates to a method for determining an intermediate circuit voltage and a determination system.

BACKGROUND

To operate an electrical system, it is necessary, among other things, that values of electrical operating parameters of this system are known.

It is possible here to use characteristic diagrams to specify an intermediate circuit voltage as an operating parameter of an electrical system in accordance with a classic pathway. In this case, such characteristic diagrams are populated or filled with values or data in the course of test bench tests, wherein such characteristic diagrams specify an ideal intermediate circuit voltage as precisely as possible as a function of a large number of parameters. However, such a classic procedure is time-consuming, not very accurate, and very machine-specific in the case of multidimensional data population of characteristic diagrams. This means that the application effort for an electrical machine is high and has to be checked and adjusted repeatedly for each newly developed electrical machine.

Document EP 2 546 969 A1 describes a method for monitoring a frequency converter.

A device and a method for detecting a phase current are known from document KR 20070072089 A.

A method for load requirement and for balancing power generation within an electrical drive system are known from document US 20100066277 A1.

Against this background, one object was to determine an operating parameter of an electrical system in a simple manner.

SUMMARY

The method according to the invention is provided to determine an intermediate circuit voltage $U_{DC,Ideal}$ as an operating parameter in an electrical system or an electric current-voltage system, wherein this electrical system comprises a battery, a DC-DC converter or direct current-direct current converter, a DC-AC converter or a direct-current-alternating current converter, and an electrical machine. The battery is connected to the DC-DC converter. The DC-DC converter is connected to the DC-AC converter. The DC-AC converter is also connected to the electrical machine. In the electrical system it is also provided that the intermediate circuit is or will be formed by the two converters, that is to say the DC-DC converter and the DC-AC converter. In the method, a line-to-line voltage $\hat{U}_{LL}$, for example a peak value of the line-to-line voltage $\hat{U}_{LL}$, which is applied between two conductors and thus between two phases of the electrical machine, is determined as a further operating parameter. In addition, a maximum degree of modulation $m_{max}$ of the line-to-line voltage $\hat{U}_{LL}$ is determined as an operating parameter and taken into consideration. The following equation or formula is used to determine the intermediate circuit voltage $U_{DC,Ideal}$:

$$U_{DC,Ideal} = \frac{\hat{U}_{LL}}{m_{max}}$$

The intermediate circuit voltage $U_{DC,Ideal}$ or a so-called ideal intermediate circuit voltage $U_{DC,Ideal}$ results from a ratio of the peak value of the line-to-line voltage $\hat{U}_{LL}$ and the maximum possible degree of modulation $m_{max}$. The peak value of the line-to-line voltage $\hat{U}_{LL}$ of the electrical machine, for example an electrical machine having a star circuit, corresponds to the product of the peak value of a line-to-ground voltage $\hat{U}_{LE}$ or a voltage between a conductor and a star point of the electrical machine multiplied by the square root of 3, i.e., $\hat{U}_{LL}=\sqrt{3}*\hat{U}_{LE}$.

During operation of the electrical system, it is possible to convert a direct current and/or a DC voltage of the battery into an alternating current or an AC voltage for the electrical machine by way of the two converters. It is also possible to convert an alternating current or an AC voltage of the electrical machine into a direct current or a DC voltage for the battery via the two converters.

It is provided that the line-to-line voltage $\hat{U}_{LL}$ describes a peak value between two conductors and thus two phases of the electrical machine. It is taken into consideration here that the electrical machine has multiple phases, multiple lines or three lines, and thus three phases.

In this regard, it is possible for the line-to-line voltage $\hat{U}_{LL}$ to be measured within the DC-AC converter, wherein a voltmeter can be used which is designed to measure the voltage applied between the respective conductors of the electrical machine.

It is also possible that the line-to-line voltage $\hat{U}_{LL}$ is determined indirectly. The line-to-line voltage $\hat{U}_{LL}$ is transmitted via a bus system, for example Flexray, CAN, or a network, for example Ethernet, to the DC-DC converter.

In one embodiment, the line-to-line voltage $\hat{U}_{LL}$ is determined indirectly by the DC-AC converter, which can transmit a determined value to the DC-DC converter via a bus system or the bus network. It is also conceivable that a limited ideal intermediate circuit voltage $U_{DC,Ideal,lim}$ is calculated in a controller or a control unit of the DC-AC converter and is transmitted via the bus system to the DC-DC converter. An indirect determination of the line-to-line voltage $\hat{U}_{LL}$ is carried out within the DC-AC converter on the basis of parameters of the electrical machine.

In addition, the maximum degree of modulation $m_{max}$ is required, which is specified by software used, usually software of the DC-AC converter. Depending on which modulation method, for example Sixstep, pulse width modulation (PWM), in particular discontinuous pulse width modulation, etc., is controlled by the software, this maximum degree of modulation $m_{max}$ can vary. Using the software or a software function, usually a software function of the DC-AC converter, the intermediate circuit voltage $U_{DC,Ideal}$ is set, wherein the maximum degree of modulation $m_{max}$ which can be mapped stably by the software is achieved at each operating point of the electrical machine.

In a further embodiment, a value of the intermediate circuit voltage $U_{DC,Ideal}$, which is a DC voltage, is delimited by a minimum value or a minimum intermediate circuit voltage and a maximum value or a maximum intermediate circuit voltage, taking into consideration a limitation block, wherein it is required that the value of the intermediate circuit voltage $U_{DC,Ideal}$ is at most as high as the maximum value and at least as small as the minimum value. A limited ideal intermediate circuit voltage $U_{DC,Ideal,lim}$ is determined from the so-called ideal intermediate circuit voltage $U_{DC,Ideal}$, taking into consideration the maximum value and the minimum value.

According to the above-mentioned equation, the intermediate circuit voltage $U_{DC,Ideal}$ is dependent on the line-toline voltage $\hat{U}_{LL}$ and the maximum degree of modulation $m_{max}$. It can be taken into consideration here that the line-to-line voltage $\hat{U}_{LL}$ results as a function of the respective operating situation of the electrical machine.

The maximum degree of modulation $m_{max}$ is only dependent on how it can be stably mapped by the software. The electrical machine has no influence on the maximum degree of modulation $m_{max}$ but does have an influence on an actual degree of modulation at a respective operating point of the electrical machine.

A choice of the limits for a minimum intermediate circuit voltage $U_{DC,min}$ and a maximum intermediate circuit voltage $U_{DC,max}$ are specified by hardware properties, usually hardware limits, of the DC-AC converter and its software, usually by its software limits. The maximum degree of modulation $m_{max}$ is specified by the software of the DC-AC converter, wherein the maximum degree of modulation $m_{max}$ can be stably mapped by the software. The maximum degree of modulation can vary depending on the modulation method used, which is controlled by the software, for example Sixstep, discontinuous PWM. The maximum intermediate circuit voltage $U_{DC,max}$ is, on the one hand, kept between the limits provided for this purpose and, on the other hand, is selected so that the maximum degree of modulation m max, which can be stably mapped by the software, is achieved at each operating point.

If an intermediate circuit voltage $U_{DC,Ideal}$ should nonetheless result whose value is greater than the maximum intermediate circuit voltage $U_{DC,max}$ or a corresponding maximum value or is less than the minimum intermediate circuit voltage $U_{DC,min}$ or a corresponding minimum value, it is provided that the value of the intermediate circuit voltage $U_{DC,Ideal}$ is to be restricted to the minimum value or maximum value and thus to be delimited accordingly, so as not to violate the hardware and software limits of the DC-AC converter.

The method presented is carried out for an electrical system of a vehicle, for example a motor vehicle. The electrical machine is used to drive or move the vehicle, wherein the electrical machine is designed to convert electrical energy from the battery, which is provided to the electrical machine via the two converters, into mechanical energy, wherein the electrical machine is used as an electric motor in this case. However, it is also possible to use the electrical machine as an electrical generator, wherein the electrical machine is used to convert mechanical energy of the moving vehicle into electrical energy, wherein this electrical energy is provided from the electrical machine to the battery via the two converters. This is usually the case when recuperation is carried out for the vehicle.

In a further embodiment, the intermediate circuit voltage $U_{DC,Ideal}$ is determined in accordance with the above-mentioned equation via the software function of the DC-AC converter.

The determination system according to the invention is designed to determine an intermediate circuit voltage $U_{DC,Ideal}$ in an electrical system. This electrical system comprises a battery, a DC-DC converter, a DC-AC converter, and an electrical machine, usually having three phases, wherein the battery is connected to the DC-DC converter, the DC-DC converter is connected to the DC-AC converter, and the DC-AC converter is connected to the electrical machine. An intermediate circuit of the electrical system comprises the DC-DC converter and the DC-AC converter, which are arranged and/or switched between the battery and the electrical machine. The determination system comprises a determination unit and a computing unit, wherein the determination unit is designed to determine a line-to-line voltage $\hat{U}_{LL}$ that is applied between two conductors of the electrical machine. The computing unit is designed to determine the intermediate circuit voltage in consideration of a maximum degree of modulation $m_{max}$ of the line-to-line voltage $\hat{U}_{LL}$ according to the equation $$U_{DC,Ideal} = \frac{\hat{U}_{LL}}{m_{max}}$$

It is provided that one embodiment of the determination system presented is designed to carry out an embodiment of the method presented here for determining the intermediate circuit voltage $U_{DC,Ideal}$. In this case, the intermediate circuit voltage $U_{DC,Ideal}$ is calculated by the computing unit in accordance with the above-mentioned equation or formula with the aid of software. In one embodiment, the determination unit is designed, for example, as a voltmeter, which in turn is designed to measure and thus determine the line-to-line voltage $\hat{U}_{LL}$ between two conductors and thus between two phases of the electrical machine. It is also possible that the determination unit is designed to indirectly determine the line-to-line voltage $\hat{U}_{LL}$, wherein the determination unit can have a bus system that is designed to transmit the usually indirectly determined value of the line-to-line voltage $\hat{U}_{LL}$ to the computing unit.

Using the method and the determination system, it is possible to determine and thus define the ideal intermediate circuit voltage $U_{DC,Ideal}$ using the equation mentioned, which can be or is implemented as a software function, depending on an operating point or an operating situation of the electrical machine. A simple analytical relationship between the ideal intermediate circuit voltage $U_{DC,Ideal}$ and the directly or indirectly detectable line-to-line voltage $\hat{U}_{LL}$, is taken into consideration in accordance with the equation presented. In consideration of this equation, an application effort for the electrical system, for example for a high-voltage (HV) electrical system, can be minimized, since here only three operating parameters, i.e., the line-to-line voltage $\hat{U}_{LL}$, the maximum degree of modulation m max, and the resulting intermediate circuit voltage $U_{DC,Ideal}$, are to be determined. The presented method is therefore suitable for optimizing an already fully developed drive train of a vehicle that interacts with the electrical system, wherein at least the electrical machine can also be designed as a component of the drive train, depending on the definition.

By using the method, among other things, an optimization of a range of the vehicle is possible due to improved efficiency in conjunction with the electrical system. Furthermore, as part of a so-called tuning measure, it is possible to optimize an electrical drive system of the vehicle that is already in series production, wherein this drive system comprises the electrical system described.

By maximizing the degree of modulation or a degree of modulation at each operating point of the electrical machine, a form of the phase currents is optimized in a basic setting range of the electrical machine. Machine losses caused by the modulation, for example PWM losses due to pulse width modulation, are minimized. The losses due to the use of the DC-DC converter are overcompensated. The level of savings in the basic setting range depends on the present battery voltage. The higher the voltage of the battery is, the higher is the potential for savings in the basic setting range due to reducing the intermediate circuit voltage $U_{DC,Ideal}$.

In a field attenuation range, a reduction in the power consumption of the electrical machine is achieved by increasing a level of the intermediate circuit voltage $U_{DC,Ideal}$. There is also a relationship to a present voltage of the battery here. The lower the present voltage of the battery is, the higher is the savings potential due to increasing the intermediate circuit voltage $U_{DC,Ideal}$.

Overall, there are also areas in which an efficiency of the described electrical system is not optimal. This is the case, for example, when the voltage of the battery corresponds to the ideal intermediate circuit voltage $U_{DC,Ideal}$. Since, from a statistical point of view, the voltage of the battery very rarely corresponds to the ideal intermediate circuit voltage $U_{DC,Ideal}$, however, an efficiency of the electrical system in overall operation can be significantly improved in total.

The equation presented here, which can also be designed or referred to as a software function, is used to determine the ideal intermediate circuit voltage $U_{DC,Ideal}$ as a function of the presently applied line-to-line voltage $\hat{U}_{LL}$. The line-to-line voltage $\hat{U}_{LL}$, is measured in one embodiment within the DC-AC converter, which, depending on the definition, can be referred to as power electronics (LE) of the electrical system. It is furthermore possible to transmit the line-to-line voltage $\hat{U}_{LL}$, via the bus system, for example Flexray, CAN (Controller Area Network) as a serial bus system or Ethernet, to the DC-DC converter. The maximum degree of modulation $m_{max}$ in the denominator of the equation is one of the three application parameters or operating parameters. The maximum degree of modulation $m_{max}$ is usually specified and/or limited by the software or a software project of the DC-AC converter.

A theoretical maximum value for the maximum degree of modulation $m_{max}$ corresponds here to a fundamental oscillation amplitude of the line-to-line voltage $\hat{U}_{LL}$. The maximum degree of modulation $m_{max}$ is $2*\sqrt{3}/\square \sim 1.1$ with a basic frequency cycle or with block operation. With a sine pulse width modulation, the maximum degree of modulation is $m_{max}\sqrt{3}/2 \sim 0.866$. In the case of space vector modulation or super-sine pulse width modulation, the maximum degree of modulation m max has the value 1 in each case.

Said software or a corresponding software project and thus the DC-AC converter is designed in one embodiment to monitor and thus control and/or regulate operation of the electrical machine.

The method takes into consideration that the electrical system, which can be designed or referred to as a high-voltage system, has or comprises its own voltage limits and thus a maximum value and an ideal value for the intermediate circuit voltage $U_{DC,Ideal}$ and/or the line-to-line voltage $\hat{U}_{LL}$. In this case, the ideal intermediate circuit voltage $U_{DC,Ideal}$, which is determined by the equation presented, is limited in a further embodiment in consideration of the maximum value and/or minimum value provided for this purpose. It is taken into consideration here that at a low speed of the electrical machine, a required line-to-line voltage $\hat{U}_{LL}$, is low. This can result in a DC voltage being requested for the intermediate circuit voltage $U_{DC,Ideal}$ which is below the permissible minimum value of the DC-AC converter or the power electronics. If, on the other hand, the speed of the electrical machine is very high, it is possible that an intermediate circuit voltage $U_{DC,Ideal}$ is required which is above the permissible maximum value as the operating voltage for the DC-AC converter or the power electronics. In such cases, a limitation block is used, by which the intermediate circuit voltage $U_{DC,Ideal}$ is limited to a limited intermediate circuit voltage $U_{DC,Ideal,lim}$, wherein an excessively high or an excessively low intermediate circuit voltage $U_{DC,Ideal}$ is prevented.

It is apparent that the above-mentioned features and the features still to be explained hereinafter are usable not only in the particular specified combination but rather also in other combinations or alone, without leaving the scope of the present invention.

BRIEF DESCRIPTION OF THE FIGURES

The invention is illustrated schematically in the drawings in the context of embodiments and will be described schematically and in detail with reference to the drawings.

The figures will be described coherently and comprehensively. The same components are assigned the same reference numerals.

DETAILED DESCRIPTION OF THE EMBODIMENTS

Figure 1:
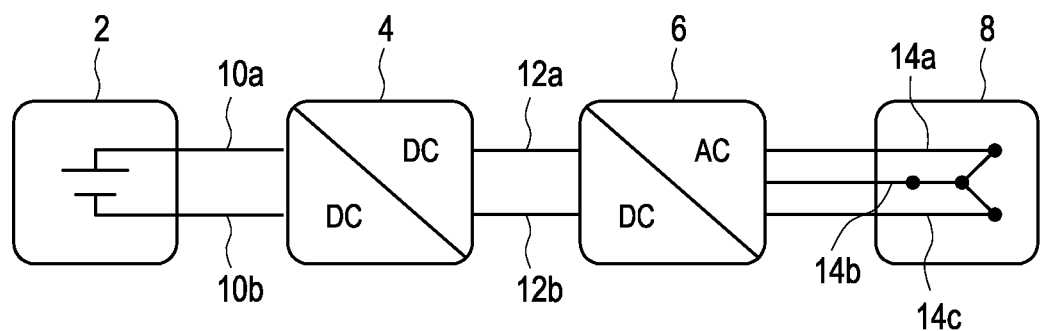
FIG. 1 shows a schematic illustration of an electrical system and an embodiment of the determination system, using which an embodiment of the method according to the invention is carried out for the electrical system.

The electrical system shown schematically in FIG. 1 comprises a battery 2, a direct current-direct current converter or DC-DC converter 4, a direct current-alternating current converter or DC-AC converter 6, and an electrical machine 8. The battery 2 and the DC-DC converter 4 are connected to one another via two lines 10a, 10b. In addition, the DC-DC converter 4 and the DC-AC converter 6, here their DC outputs, are connected to one another via two lines 12a, 12b. Furthermore, the electrical machine 8 has three conductors 14a, 14b, 14c or phases, wherein one conductor 14a, 14b, 14c or one line is connected in each case to the DC-AC converter 6, here to its AC output. The electrical system shown has a high-voltage or HV system topology. The electrical system is also designed as part of a high-voltage traction network for a vehicle, for example a motor vehicle.

Figure 2:
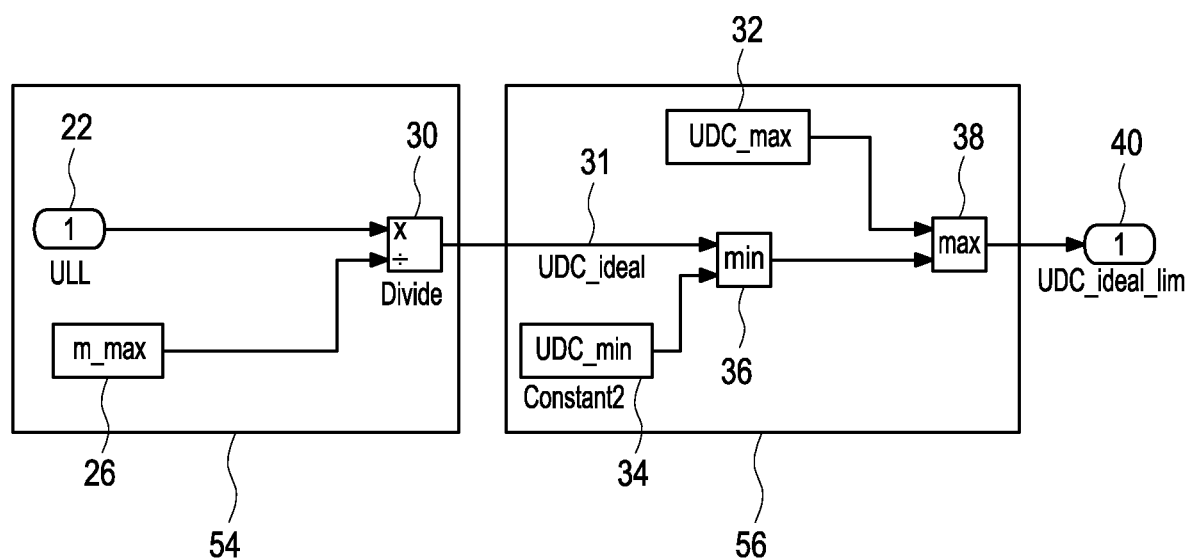
FIG. 2 shows a schematic illustration of a diagram which is used in the embodiment of the method.

FIG. 1 also shows a schematic illustration of an embodiment of the determination system according to the invention, which here comprises a determination unit 50 and a computing unit 52, wherein this embodiment of the determination system is designed to carry out the embodiment of the method according to the invention for determining an intermediate circuit voltage 31 $U_{DC,Ideal}$, as it is indicated in the diagram of FIG. 2. In a further embodiment, a limited ideal intermediate circuit voltage 40 $U_{DC,Ideal,lim}$ is also determined.

It is provided here that a line-to-line voltage 22 $\hat{U}_{LL}$, between two conductors 14a, 14b, 14c of the electrical machine 8 is determined using the determination unit 50, wherein the line-to-line voltage 22 $\hat{U}_{LL}$, is indicated in the diagram from FIG. 2. In the method, an algorithm, as is shown on the basis of the diagram from FIG. 2, is taken into consideration with software assistance by the computing unit 52. This diagram is divided into a first block 54 and a second block 56.

In the method, the line-to-line voltage 22 $\hat{U}_{LL}$, is divided at a division 30 by the maximum degree of modulation 26 $m_{max}$, wherein an ideal intermediate circuit voltage 31 $U_{DC,Ideal}$ is determined.

In the embodiment of the method presented here, the first block 54 represents an equation $$U_{DC,Ideal} = \frac{\hat{U}_{LL}}{m_{max}},$$

which is used by the computing unit 52 and describes a dependency of the intermediate circuit voltage 31 $U_{DC,Ideal}$ on the line-to-line voltage 22 $\hat{U}_{LL}$.

In a further embodiment of the method, a second block 56 is also taken into consideration by the computing unit 52, using which a limitation of the ideal intermediate circuit voltage 31 $U_{DC,Ideal}$ determined on the basis of the equation is carried out, wherein this second block 56 can also be referred to as a limitation block. A minimum value 32 $U_{DC,min}$ for the intermediate circuit voltage 31 $U_{DC,Ideal}$ and a maximum value 34 $U_{DC,max}$ for the intermediate circuit voltage 31 $U_{DC,Ideal}$ are defined and/or predetermined via this second block 56. The ideal intermediate circuit voltage 31 $U_{DC,Ideal}$ is compared in a first comparison 36 to the minimum value 32 $U_{DC,min}$. In addition, the ideal intermediate circuit voltage 31 $U_{DC,Ideal}$ determined using the equation is also compared in a second comparison 38 to the maximum value 34 $U_{DC,max}$ for the intermediate circuit voltage 31 $U_{DC,Ideal}$.

If the first comparison 36 shows that the ideal intermediate circuit voltage 31 $U_{DC,Ideal}$ is to be lower than the minimum value 32 $U_{DC,min}$ provided for this purpose, a limited ideal intermediate circuit voltage 40 $U_{DC,Ideal,lim}$ determined as part of the limitation is set to the minimum value 32 $U_{DC,min}$. If, on the other hand, the second comparison 38 shows that the ideal intermediate circuit voltage 31 $U_{DC,Ideal}$ calculated using the equation is to be greater than the maximum value 34 $U_{DC,max}$ provided for this purpose, the limited ideal intermediate circuit voltage 40 $U_{DC,Ideal,lim}$ to be determined is set to the maximum value 34 $U_{DC,max}$. If the ideal intermediate circuit voltage 31 $U_{DC,Ideal}$ determined via the equation is to be minimally as low as the minimum value 32 $U_{DC,min}$ or maximally as high as the maximum value 34 $U_{DC,max}$, the limited ideal intermediate circuit voltage 40 $U_{DC,ideal,lim}$ also corresponds to the ideal intermediate circuit voltage 31 $U_{DC,Ideal}$.

Such a limitation is carried out to protect components of the DC-AC converter 6 and to ensure that the DC-AC converter 6 functions properly. The line-to-line voltage 22 $\hat{U}_{LL}$, is set by the DC-AC converter 6, wherein the line-to-line voltage 22 $\hat{U}_{LL}$, is also independent of a limited ideal intermediate circuit voltage 40 $U_{DC,Ideal,lim}$, which is adapted accordingly. If the electrical machine 8 is designed in one embodiment as a permanent-magnet synchronous machine (PSM), it is conceivable that it can influence the line-to-line voltage 22 $\hat{U}_{LL}$ in towed operation of the vehicle.

Without the use of the DC-DC converter 4, a voltage of the battery and thus the input voltage of the DC-AC converter 6 also change between the limits, i.e., between the minimum value 32 $U_{DC,min}$ and the maximum value 34 $U_{DC,max}$. A voltage at the input of the DC-AC converter 6 can be influenced using the DC-DC converter 4.

LIST OF REFERENCE SIGNS 2 battery
4 DC-DC converter
6 DC-AC converter
8 electrical machine
10a, 10b line
12a, 12b line
14a, 14b, conductor
14c
22 line-to-line voltage
26 degree of modulation
30 division
31 ideal intermediate circuit voltage
32 minimum value
34 maximum value
36 comparison
38 comparison
40 limited ideal intermediate circuit voltage
50 determination unit
52 computing unit
54 block
56 block

The invention claimed is:

1. A method for determining an intermediate circuit voltage $U_{DC,Ideal}$ in an electrical system, which includes a battery, a DC-DC converter, a DC-AC converter, and an electrical machine, the method comprising:
   connecting the battery to the DC-DC converter;
   connecting the DC-DC converter to the DC-AC converter;
   connecting the DC-AC converter to the electrical machine, wherein an intermediate circuit of the electrical system is formed by the DC-DC converter and the DC-AC converter,
   determining a line-to-line voltage $\hat{U}_{LL}$, which is applied to a conductor of the electrical machine;
   determining a maximum degree of modulation $m_{max}$ of the line-to-line voltage $\hat{U}_{LL}$ is determined; and
   determining the intermediate circuit voltage $U_{DC,Ideal}$ according to the equation $$U_{DC,Ideal} = \frac{\hat{U}_{LL}}{m_{max}},$$

wherein a limitation block is applied to the determined intermediate circuit voltage $U_{DC,Ideal}$ to protect the DC-AC converter.

2. The method as claimed in claim 1, wherein the line-to-line voltage $\hat{U}_{LL}$ describes a peak value of a voltage between the conductor and ground.

3. The method as claimed in claim 2, further comprising:
   determining the line-to-line voltage $\hat{U}_{LL}$ indirectly; and
   transmitting the line-to-line voltage $\hat{U}_{LL}$ to the DC-DC converter via a bus system.

4. The method as claimed in claim 2, further comprising:
   varying the maximum degree of modulation $m_{max}$.

5. The method as claimed in claim 2, wherein the intermediate circuit voltage $U_{DC,Ideal}$ is delimited by a minimum value and a maximum value, taking into consideration the limitation block.

6. The method as claimed in claim 2, which is carried out for an electrical system of a vehicle, wherein the electrical machine is used to drive the vehicle.

7. The method as claimed in claim 1, further comprising:
   measuring the line-to-line voltage $\hat{U}_{LL}$ within the DC-AC converter.

8. The method as claimed in claim 7, further comprising: varying the maximum degree of modulation $m_{max}$.

9. The method as claimed in claim 7, wherein the intermediate circuit voltage $U_{DC,Ideal}$ is delimited by a minimum value and a maximum value, taking into consideration the limitation block.

10. The method as claimed in claim 7, which is carried out for an electrical system of a vehicle, wherein the electrical machine is used to drive the vehicle.

11. The method as claimed in claim 1, further comprising:
  determining the line-to-line voltage $\hat{U}_{LL}$ is determined indirectly; and
  transmitting the line-to-line voltage $\hat{U}_{LL}$ is transmitted to the DC-DC converter via a bus system.

12. The method as claimed in claim 11, further comprising:
  varying the maximum degree of modulation $m_{max}$.

13. The method as claimed in claim 11, wherein the intermediate circuit voltage $U_{DC,Ideal}$ is delimited by a minimum value and a maximum value, taking into consideration the limitation block.

14. The method as claimed in claim 1, further comprising: varying the maximum degree of modulation $m_{max}$.

15. The method as claimed in claim 14, wherein the intermediate circuit voltage $U_{DC,Ideal}$ is delimited by a minimum value and a maximum value, taking into consideration the limitation block.

16. The method as claimed in claim 1, wherein the intermediate circuit voltage $U_{DC,Ideal}$ is delimited by a minimum value and a maximum value, taking into consideration the limitation block.

17. The method as claimed in claim 1, which is carried out for an electrical system of a vehicle, wherein the electrical machine is used to drive the vehicle.

18. The method as claimed in claim 1, further comprising: determining the intermediate circuit voltage $U_{DC,Ideal}$ via a software function.

19. A determination system for determining an intermediate circuit voltage $U_{DC,Ideal}$ in an electrical system, comprising:
  a battery;
  a DC-DC converter;
  a DC-AC converter; and an
  electrical machine, wherein the battery is connected to the DC-DC converter, the DC-DC converter is connected to the DC-AC converter, and the DC-AC converter is connected to the electrical machine, an intermediate circuit of the electrical system is formed by the DC-DC converter and the DC-AC converter, the determination system has a determination unit and a computing unit, the determination unit is configured to determine a line-to-line voltage $\hat{U}_{LL}$, which is applied to a conductor of the electrical machine, the computing unit is configured to determine the intermediate circuit voltage $U_{DC,Ideal}$ taking into consideration a maximum degree of modulation $m_{max}$ of the intermediate circuit voltage $U_{DC,Ideal}$ according to the equation $$U_{DC,Ideal} = \frac{\hat{U}_{LL}}{m_{max}},$$

wherein a limitation block is applied to the determined intermediate circuit voltage $U_{DC,Ideal}$ to protect the DC-AC converter.

20. The method as claimed in claim 2, further comprising: measuring the line-to-line voltage $\hat{U}_{LL}$ within the DC-AC converter.

* * * * *